(12) United States Patent
Tanaka et al.

(10) Patent No.: US 7,820,489 B2
(45) Date of Patent: Oct. 26, 2010

(54) METHOD OF MANUFACTURING SEMICONDUCTOR APPARATUS

(75) Inventors: Takekazu Tanaka, Kanagawa (JP); Kouhei Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 710 days.

(21) Appl. No.: 11/727,008

(22) Filed: Mar. 23, 2007

(65) Prior Publication Data

US 2007/0249152 A1     Oct. 25, 2007

(30) Foreign Application Priority Data

Apr. 19, 2006   (JP)   ............... 2006-115133

(51) Int. Cl.
*H01L 21/00*   (2006.01)

(52) U.S. Cl. ............... 438/123; 257/E21.517

(58) Field of Classification Search .......... 257/E21.517, 257/673; 438/123
See application file for complete search history.

(56) References Cited

U.S. PATENT DOCUMENTS

| | | | |
|---|---|---|---|
| 4,845,335 A | | 7/1989 | Andrews et al. |
| 4,978,835 A | * | 12/1990 | Luijtjes et al. ......... 219/121.64 |
| 5,164,566 A | * | 11/1992 | Spletter et al. ......... 219/121.63 |
| 5,892,270 A | | 4/1999 | Pan |
| 6,903,450 B2 | | 6/2005 | Funato et al. |
| 7,138,673 B2 | * | 11/2006 | Tanaka ...................... 257/288 |
| 2002/0130114 A1 | | 9/2002 | Evers |
| 2003/0183605 A1 | | 10/2003 | Vivet |
| 2005/0194423 A1 | | 9/2005 | Okita |
| 2005/0212101 A1 | | 9/2005 | Funato et al. |

FOREIGN PATENT DOCUMENTS

| | | |
|---|---|---|
| CN | 1531044 A | 9/2004 |
| EP | 1 333 481 A1 | 8/2003 |
| JP | 61-053737 | 3/1986 |
| JP | 8-64634 A | 6/1996 |
| JP | 2001-68502 A | 3/2001 |
| JP | 2002-313851 | 10/2002 |
| JP | 2002-314018 | 10/2002 |
| WO | WO 91/00617 | 1/1991 |

OTHER PUBLICATIONS

European Patent Office Search Report on Application No. 07007105.5 mailed Jul. 27, 2010; 6 pages.

* cited by examiner

*Primary Examiner*—N Drew Richards
*Assistant Examiner*—Grant S Withers
(74) *Attorney, Agent, or Firm*—Foley & Lardner LLP

(57) ABSTRACT

A method of manufacturing a semiconductor apparatus includes forming an electrode on a semiconductor device, forming a conductive bump on the electrode, placing an external wire on the conductive bump, and laser-welding the external wire and the conductive bump to establish electrical connection.

14 Claims, 7 Drawing Sheets

RELATED ART

METHOD OF MANUFACTURING SEMICONDUCTOR APPARATUS

BACKGROUND OF THE INVENTION

1. Field of the Invention

The present invention relates to a method of manufacturing a semiconductor apparatus and, particularly, to a method of manufacturing a semiconductor apparatus for large-current or low-resistance use.

2. Description of Related Art

Metal-Oxide-Semiconductor Field-Effect Transistors (MOSFETs) that are used for power supply in consumer-electronics products such as cell phones, personal computers and digital audiovisual equipments or for driving of vehicle motors carry a high current of about 1 to 200 A. It thus requires a thick external wire with a large cross sectional area. Therefore, in order to draw a high current, a plurality of large-gauge bonding wires of about 100 to 500 μm have been connected as an external wire to a source electrode of a MOSFET.

However, the bonding wires are connected to the source electrode typically by ultrasonic bonding or thermocompression bonding, and it requires a bonding area of about 1.5 to 3 times the wire cross-sectional area. The area of the source electrode or the gate electrode, however, is limited to small and there is thus a limit to enlarge the wire cross-sectional area. Further, a larger wire cross-sectional area requires higher pressure application to obtain a larger bonding strength, and the mechanical impact causes damage to a semiconductor device. Furthermore, the looping of large-gauge bonding wires leads to a decrease in productivity.

To address these, a semiconductor apparatus and a manufacturing method of the same as described in Japanese Unexamined Patent Application Publication Nos. 2002-313851 (Oono et al.) and 2002-314018 (Funato et al.) use a flat-plate electric path member, instead of a bonding wire, as an external wire to thereby enlarge the cross-sectional area of the external wire. FIGS. 6A and 6B are a horizontal cross-sectional view and a vertical cross-sectional view, respectively, of a semiconductor device (Small Out-line Package (SOP)—8 packages) taught by Oono.

In the semiconductor apparatus 101 of FIGS. 6A and 6B, a semiconductor device 105 is included in a molding resin 102. On the semiconductor device 105, a source electrode 104s and a gate electrode 104g are formed on the top surface, and a drain electrode (not shown) is formed on the under surface.

Four drain-side terminals 103b out of eight leads are integrated into one set to form a drain-side post 107d inside the molding resin 102. The semiconductor device 105 is placed above the drain-side post 107d, such that the drain-side post 107d is electrically connected with the drain electrode (not shown). Out of the remaining four leads, three source-side terminals 103s are integrated into one set to form a source-side post 107s inside the molding resin 102, and one gate-side terminal 103g forms a gate-side post 107g inside the molding resin 102.

The source-side post 107s and the source electrode 104s are electrically connected by an electric path member 106. An electrode-side connecting portion 106a formed at one end of the electric path member 106 and the source electrode 104s, and a lead-side connecting portion 106b formed at the other end of the electric path member 106 and the source-side post 107s, respectively, are connected by ultrasonic bonding in direct contact with each other. The use of the flat-plate electric path member 106 allows the cross sectional area of the current path flowing between the source-side post 107s and the source electrode 104s to be significantly larger than that of the current path flowing through a plurality of bonding wires. The gate-side post 107g is electrically connected with the gate electrode 104g by one boding wire 108.

As a bonding technique that does not give mechanical damage to a semiconductor device, wire bonding using laser is known. FIG. 7 is a cross-sectional view showing a semiconductor apparatus according to Japanese Unexamined Patent Application Publication No. 61-53737 (FIG. 2) (Matsuda et al.). A semiconductor device 201 is placed on a die pad 203 of a lead frame. An electrode pad 202 placed on the semiconductor device 201 and a lead 204 of the lead frame are electrically connected by a bonding wire 205. The wire 205 and the electrode pad 202 are connected by laser welding.

However, the ultrasonic bonding process taught by Oono et al. and Funato et al. can cause mechanical damage to the semiconductor device due to ultrasonic vibration. Further, because it is a mechanical bonding process, the bonding can be difficult for some metals.

Specifically, a step of mounting a semiconductor device on a die pad (island) of a lead frame is carried out at the temperature of 300° C. or higher; as a result, an oxide film is formed on the surface of the electrode of the semiconductor device. In order to provide mechanical bonding between the external wire and the electrode at low temperature, it is necessary to break the oxide film on the electrode surface to exposure a new surface. As such, ultrasonic vibration is applied to the external wire and the electrode that are arranged in contact with each other. However, if the external wire has a large cross-sectional area, the mechanical impact to be applied to the electrode due to the vibration of the external wire becomes large, which can cause the mechanical damage to reach the semiconductor device under the electrode. Particularly, a MOSFET has an active cell immediately under the electrode and a product can be breakdown. Further, the bonding is difficult for Cu or the like with a thick surface oxide film.

On the other hand, the laser bonding process taught by Matsuda et al. can cause thermal damage to the semiconductor device under the electrode. As described above, large-gauge wires of about 100 to 500 μm or above are used to reduce the resistance in order for the MOSFET to carry a high current. This corresponds to the thickness of 100 to 500 μm. On the other hand, the thickness of the electrode is as small as about 2 to 6 μm as described in Oono et al. The adjustment of laser intensity is extremely difficult when laser-welding the members having significantly different thicknesses because high laser intensity leads to thermal damage to the semiconductor device by laser, and low laser intensity fails to establish connection or obtain desired connection intensity.

SUMMARY OF THE INVENTION

According to one aspect of the present invention, there is provided a method of manufacturing a semiconductor apparatus including forming an electrode on a semiconductor device, forming a conductive bump on the electrode, placing an external wire on the conductive bump, and laser-welding the external wire and the conductive bump to establish electrical connection.

The present invention provides a method of manufacturing a semiconductor apparatus capable of preventing mechanical and thermal damage to a semiconductor device and providing high reliability and productivity.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Exemplary embodiments of the present invention are described hereinafter. The present invention, however, is not limited to the below-described embodiments. The following description and the attached drawings are appropriately simplified to clarify the description.

A first embodiment of the present invention is described hereinbelow in detail with reference to the drawings. In the first embodiment, the present invention is applied to a semiconductor apparatus for high-current or low-resistance use in which a number of MOSFETs are combined into one MOSFET. While a single transistor normally carries a current of about 0.1 A, such a transistor can carry a current of about 1 to 200 A and can be used for power supply in consumer-electronics products, driving of vehicle motors, or the like.

Figure 1A:
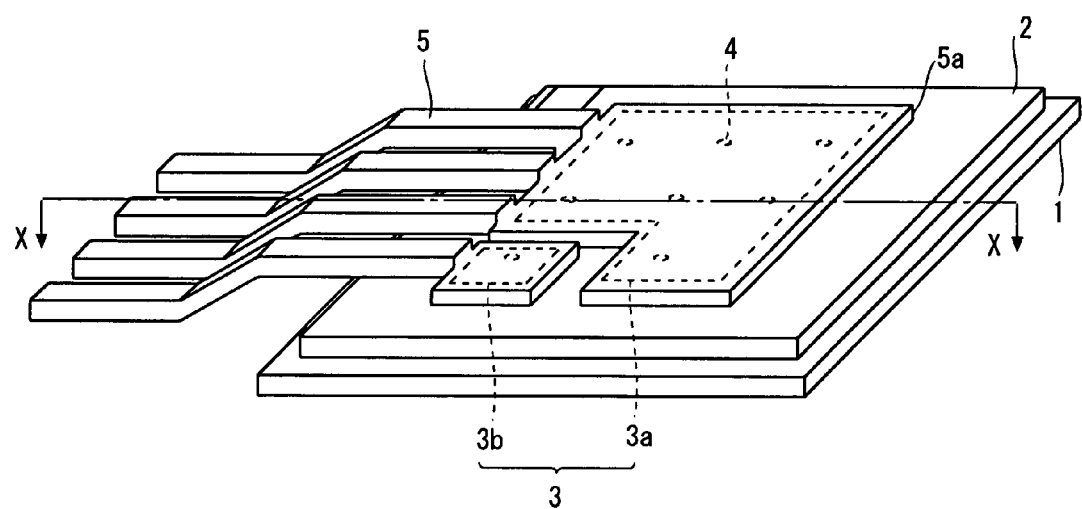
FIG. 1A is a perspective view showing a semiconductor apparatus according to a first embodiment of the present invention.

FIG. 1A is a perspective view of a semiconductor apparatus according to the first embodiment of the present invention.

Figure 1B:
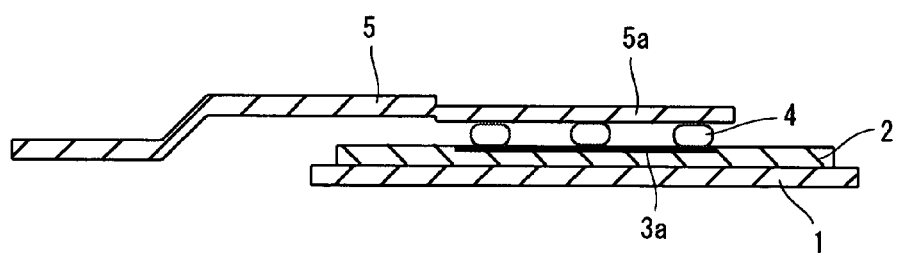
FIG. 1B is a cross-sectional view along line X-X in FIG. 1A.

FIG. 1B is a cross-sectional view along line X-X in FIG. 1A. As shown in FIGS. 1A and 1B, the semiconductor apparatus includes a die pad (island) 1 of a lead frame, a semiconductor device (die) 2, an electrode pad 3, a conductive bump 4, and a lead 5 of a lead frame. Typically, these elements are covered with a molding resin made of an epoxy resin or the like and packaged entirely except for one end (external lead) of the lead 5.

The die pad 1 is a part of a lead frame. The lead frame is made of a metal that mainly contains Au, Cu, Ni, Ag, Al, or Pd. A metal material may be formed on the surface of the die pad 1. In other words, the die pad 1 may be plated with Ni, Ag or the like as needed.

The semiconductor device (die) 2, which may be a vertical MOSFET, is placed on the die pad 1. A drain electrode (not shown) is placed on the under surface of the semiconductor device 2 and connected with the die pad 1.

The electrode pad 3 is placed on the semiconductor device 3 and includes a source electrode 3a and a gate electrode 3b as shown in FIG. 1A. The electrode pad 3 may be a metal film with the thickness of about 5 μm which mainly contains Au, Cu, Ni, Ag, Al, or Pd.

The conductive bump 4 is placed on the electrode pad 3 and electrically connected therewith. The conductive bump 4 is made of Au, Cu, Ni, Ag, Al or Pd, or an alloy mainly containing those. The use of various kinds of solder is also possible. The height of the conductive bump 4 is appropriately set according to the thickness of a connecting portion 5a.

Specifically, the thickness of the connecting portion 5a is set to 1 to 30 times the height of the conductive bump 4 so as to prevent thermal damage to the semiconductor device 2 due to laser welding and to obtain suitable connection intensity. Being more than 30 times causes the adjustment of laser intensity to be extremely difficult. If the laser intensity is too high, laser reaches the electrode pad 3, or even the semiconductor device 2, under the conductive bump 4 to cause thermal damage thereto. If, on the other hand, the laser intensity is too low, it fails to establish connection or obtain desired connection intensity. Being less than 1 time does not cause any problem to laser welding; however, if the thickness of the connecting portion 5a is too small, resistance increases to cause the degradation of electrical characteristics for high-current or low-resistance use. The height of the conductive bump 4 is set to about 5 μm or larger to prevent thermal damage from being given to the semiconductor device 2 due to laser welding. The thickness of the connecting portion 5a should be at least 5 μm, though it depends on the cross sectional area and resistance. If the height of the conductive bump 4 is larger, the thickness of the connecting portion 5a may be less than 1 time the height of the conductive bump 4. However, the resistance is low when it is less than 1 time. More preferably, the thickness of the connecting portion 5a is 1 to 10 times the height of the conductive bump 4.

The lead 5 is a part of a lead frame that may be the same as or different from the die pad 1, and it corresponds to an external wire according to the present invention. One end (internal lead) of the lead 5 is placed on the conductive bump 4. As shown in FIG. 1A, the internal lead according to the first embodiment has the flat-plate connecting portion 5a. The connecting portion 5a and the conductive bump 4 are laser-welded and electrically connected with each other. The contact area between the connecting portion 5a and the conductive bump 4 may be designed in light of desired current and resistance values. The lead 5 and the conductive bump 4 are connected directly without through a separate wire or the like. This eliminates an additional connecting portion to thereby provide a more reliable semiconductor apparatus. The other end (external lead) of the lead 5 is exposed outside the package and typically soldered onto a printed circuit board. Alternatively, the other end of the lead 5 may be laser-welded with a conductive bump that is placed on an electrode pad of another semiconductor device, so that two semiconductor devices are connected through the lead 5.

The area of the connecting portion 5a may be larger than the area of the electrode pad 3 but should be smaller than the semiconductor device 2. This is because the positioning for the laser welding is performed by recognizing the semiconductor device 2. This facilitates the positioning.

In a typical structure of a MOSFET, a gate electrode is placed below the source electrode with an insulating film interposed therebetween. The insulating film may be formed of BPSG (boron phosphorous silicate glass), PSG (phosphorous silicate glass) or the like which are oxide silicon glass added with phosphorous or boron. If damage is given to the insulating film by laser welding, the MOSFET becomes inoperable. The insulating film is thus preferably formed of a heat resistant material.

A method of manufacturing a semiconductor apparatus according to the first embodiment of the invention is described hereinafter. A lead frame having the flat-plate connecting portion 5a at an end of the lead 5 is prepared. The lead frame may be formed by patterning a thin-plate metal material by stamping, etching or the like. The connecting portion 5a is formed at an end of the lead 5 of the lead frame such that it has a given thickness in accordance with the size and shape of the source electrode 3a and the gate electrode 3b on the semiconductor device 2.

The connecting portion 5a may be plated with Ni, Ag or the like as needed. Particularly, Cu and Cu alloy are highly conductive and thus suitable as a lead frame material but less absorbent to laser. In order to facilitate the laser welding, it is possible to plate Ni with high laser absorptivity on the surface or to use a Cu—Ni cladding material that is obtained by rolling the lamination of a Ni plate on a Cu plate. The use of Cu—Ni alloy is also possible.

Then, each semiconductor device 2 that is diced out from a semiconductor wafer is placed on the die pad 1, and the conductive bump 4 is formed on the electrode pad 3 by ultrasonic bonding. Specifically, an end of a wire-like material for the conductive bump 4 is heated and melted to form a ball, ultrasonic bonded, and then cut, thereby creating the conductive bump 4. The size of each conductive bump 4 may be about 30 to 200 µm in diameter and about 25 to 90 µm in height, which are smaller than the connecting portion 5a and the flat-plate current path member according to Oono et al. and Funato et al., so that the ultrasonic bonding of this step does not give any mechanical damage to the semiconductor device 2. The die pad 1 and the semiconductor device 2 may be electrically connected by solder, silver paste or the like.

A method of creating the conductive bump 4 is not limited to the above-described ultrasonic bonding. For example, the conductive bump 4 may be created by electrolytic plating or electroless plating on a semiconductor wafer. It is easy to form the conductive bump 4 with the thickness of about 5 to 20 µm. The conductive bump 4 is not limited to ball-shaped and it may be column or plug shaped. This method enables the creation of the conductive bumps 4 at a time on each semiconductor device and also enables the reduction of mechanical damage due to ultrasonic bonding. The size of the conductive bump 4 may be enlarged to 100 µm or above, which increases the laser welding area to thereby further reduce the resistance.

After that, the conductive bump 4 formed on the source electrode 3a and the gate electrode 3b is overlapped with the connecting portion 5a of the lead 5. As described earlier, the lead 5 may be a lead of a different lead frame from the die pad 1. The positioning of the semiconductor device 2 for laser welding can be performed at the accuracy of about 100 µm, which is easy. On the other hand, for the ultrasonic bonding of a flat-plate external wire as described in Oono et al, it is necessary to vibrate the bonding portion of the flat-plate external wire as the bonding portion in close contact with the electrode of the semiconductor device. It is thereby necessary to perform the positioning such that the bonding portion of the flat-plate external wire does not protrude from an opening of a protective film where the electrode of the semiconductor device is exposed. The semiconductor device is normally covered with a protective film which has an opening to expose the electrode of the semiconductor device. The external wire is laid out by mechanical handling, and the positioning accuracy is about ±25 µm at present. In order to decrease the required positioning accuracy, it is necessary to enlarge a margin between the bonding portion of the flat-plate electric path member and the opening to expose the electrode of the semiconductor device. This requires an increase in the size of the semiconductor device or a decrease in the size of the bonding portion (to increase resistance). On the other hand, in the present invention, the conductive bumps 4 are sandwiched between the bonding portion 5a of the lead 5 and the protective film so as to avoid contact between the bonding portion 5a and the protective film. Therefore, it is possible to deviate from an opening to expose the electrode of the semiconductor device, and the displacement of about ±100 µm is allowable.

Figure 2A:
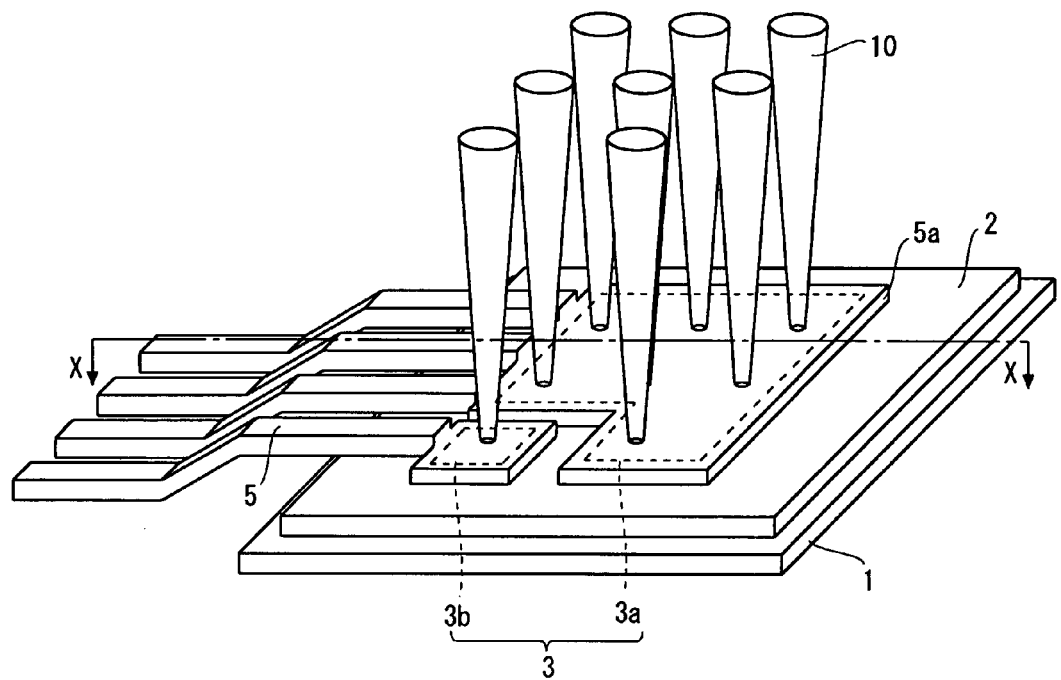
FIG. 2A is a perspective view showing a method of manufacturing a semiconductor apparatus according to the first embodiment of the present invention.
Figure 2B:
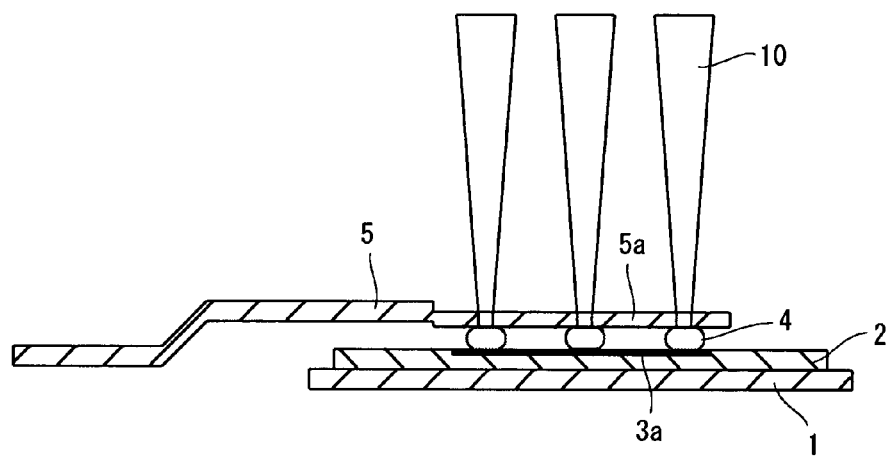
FIG. 2B is a cross-sectional view along line X-X in FIG. 2A.

Then, as shown in FIGS. 2A and 2B, laser is applied from the top of the lead 5 to partly fuse the connecting portion 5a of the lead 5 and the conductive bump 4 to thereby weld the metals. The use of a galvanometer for the laser welding enables one-time connection to enhance the productivity. Even if a slight gap exists between the connecting portion 5a and the conductive bump 4, the connecting portion 5a and the conductive bump 4 are fused by the laser welding and thus bonded together. Although all of the conductive bumps 4 are laser-welded in FIGS. 2A and 2B, it is not necessary to perform the laser welding on all the conductive bumps 4.

Finally, the part of the lead 5 other than the external lead is sealed by the molding resin for packaging.

As described above, the method of manufacturing a semiconductor apparatus according to the first embodiment of the invention performs the laser welding of the connecting portion 5a and the conductive bump 4, thereby preventing mechanical damage to the semiconductor device 2. Further, with the use of the conductive bump 4, thermal damage to the semiconductor device 2 can be avoided by adjusting the height of the conductive bump 4 based on the thickness of the connecting portion 5a. It is thereby possible to provide a semiconductor apparatus with high reliability and productivity.

The method of manufacturing a semiconductor apparatus according to the first embodiment further has the following advantages. Because the connecting portion 5a of the lead 5 and the conductive bump 4 are melted and bonded by way of the laser welding, it is possible to bond the metals that have thick oxide films on their surfaces and thus difficult to be bonded by ultrasonic bonding. Further, because it is a room temperature process in which heat is generated only in the welding portion, it is possible to prevent the oxidation of the read frame or the electrode pads of the semiconductor device 2. Furthermore, the productivity is high because of easy positioning, availability of one-time connection, and elimination of the need for wire looping.

Second Embodiment

A second embodiment of the present invention is described hereinafter. Although the lead 5 and the conductive bump 4 formed on the electrode pad 3 are connected directly in the first embodiment, the lead 5 and the conductive bump 4 may be connected through a separate connecting member. In the second embodiment, a ribbon-like connecting member 17 is used for the connection between the lead 5 of the lead frame and the conductive bump 4. Thus, the ribbon-like connecting member 17 corresponds to an external wire according to the present invention.

Figure 3A:
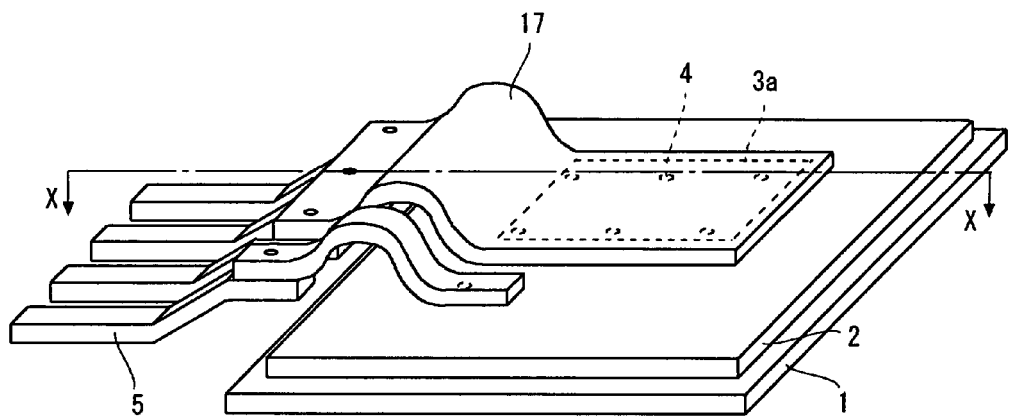
FIG. 3A is a perspective view showing a semiconductor apparatus according to a second embodiment of the present invention.
Figure 3B:
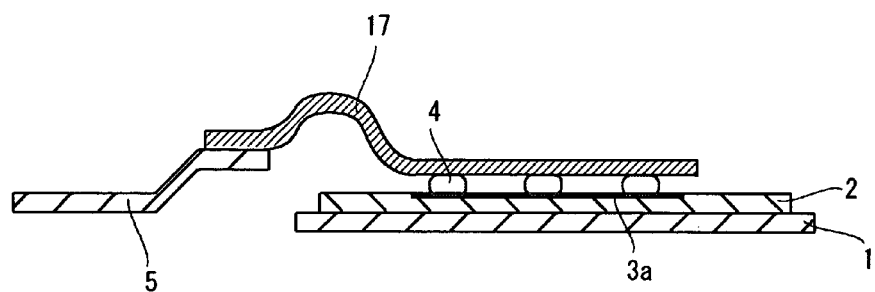
FIG. 3B is a cross-sectional view along line X-X in FIG. 3A.

FIG. 3A is a perspective view of a semiconductor apparatus according to the second embodiment of the present invention, and FIG. 3B is a cross sectional view along line X-X in FIG. 3A. In the following description, the same elements as in the first embodiment are denoted by the same reference numerals and not described in detail herein.

Figure 4:
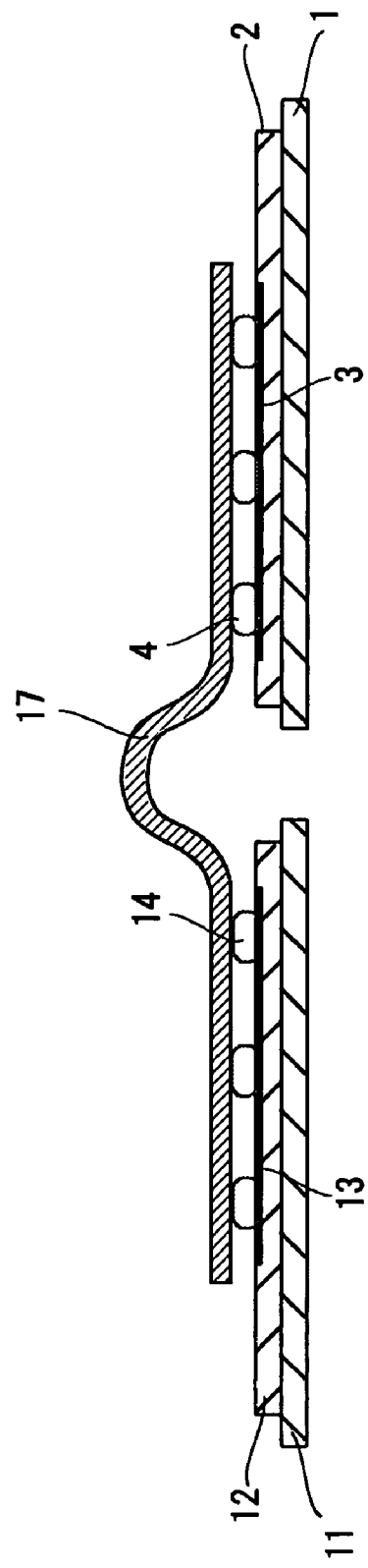
FIG. 4 is a cross-sectional view showing a semiconductor apparatus including two semiconductor devices according to the second embodiment of the present invention.

As shown in FIGS. 3A and 3B, one end of the ribbon-like connecting member 17 and the lead 5 are electrically connected, and the other end of the ribbon-like connecting member 17 and the conductive bump 4 are also electrically connected. The ribbon-like connecting member 17 is made of Au, Cu, Ni, Ag, Al or Pd or an alloy mainly containing these. The connection of the ribbon-like connecting member 17 with the conductive bump 4 and with the lead 5 is made by laser welding. As shown in FIG. 4, one end of the ribbon-like connecting member 17 may be laser-welded with a conductive bump 14 that is formed on an electrode pad 13 of another semiconductor device 12 that is different from the semiconductor device 2, rather than with the lead 5, so that two semiconductor devices are connected through the ribbon-like connecting member 17. Although in FIG. 4 the semiconductor device 2 and the semiconductor device 12 are mounted on the die pad 1 and a die pad 11, respectively, they may be mounted on the same die pad.

The thickness of the ribbon-like connecting member 17 is preferably 1 to 30 times the height of the conductive bump 4 for the same reason as in the first embodiment. The thickness of the lead 5 is not particularly limited. Stable laser welding may be performed because the thickness of the lead 5 is normally larger than the thickness of the ribbon-like connecting member 17.

The method of manufacturing a semiconductor apparatus according to the second embodiment of the invention performs the laser welding of the ribbon-like connecting member 17 and the conductive bump 4, thereby preventing mechanical damage to the semiconductor device 2. Further, with the use of the conductive bump 4, thermal damage to the semiconductor device 2 can be avoided by adjusting the height of the conductive bump 4 based on the thickness of the ribbon-like connecting member 17. It is thereby possible to provide a semiconductor apparatus with high reliability and productivity.

Third Embodiment

Figure 5A:
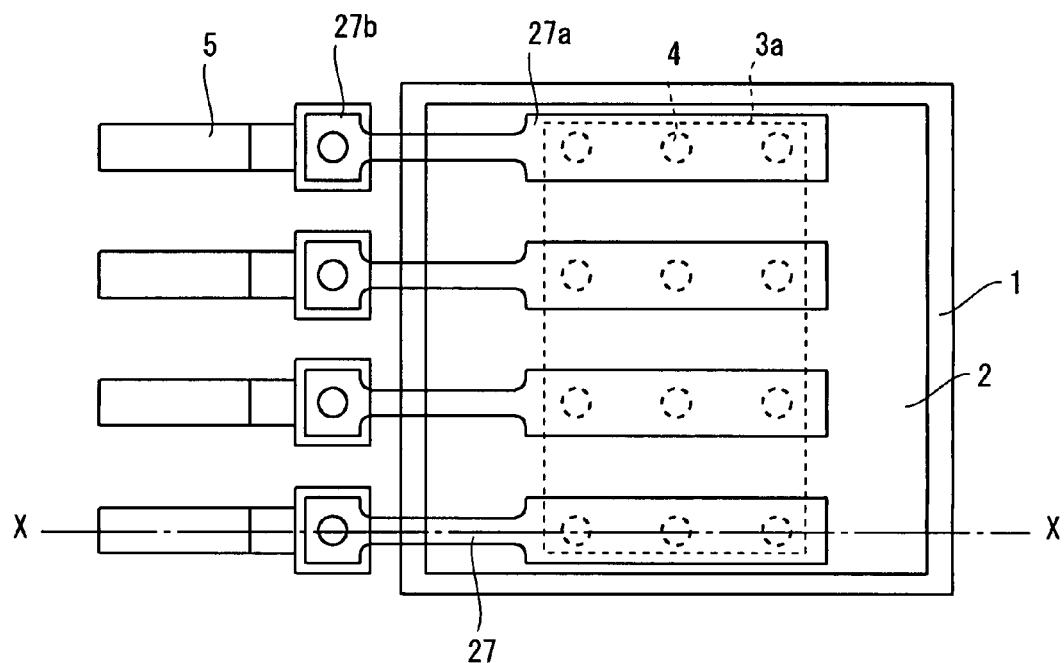
FIG. 5A is a plan view showing a semiconductor apparatus according to a third embodiment of the present invention.
Figure 5B:
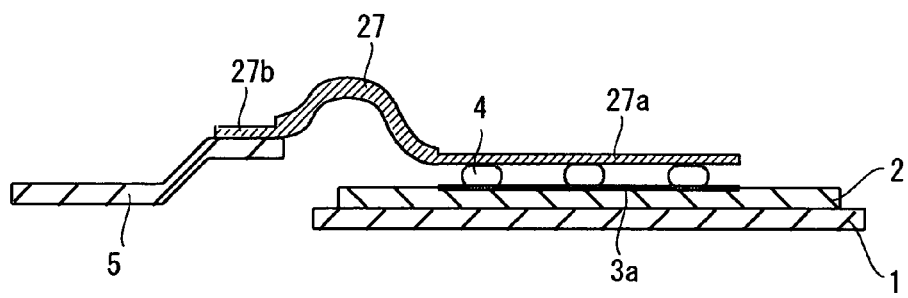
FIG. 5B is a cross-sectional view along line X-X in FIG. 5A.
Figure 6A:
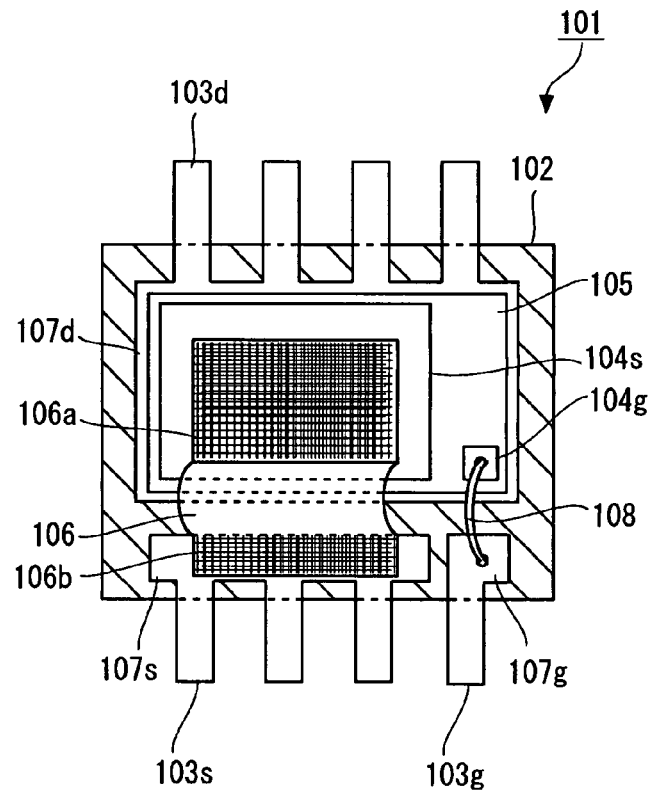
FIG. 6A is a plan view showing a semiconductor apparatus according to Japanese Unexamined Patent Application Publication No. 2002-313851.
Figure 6B:
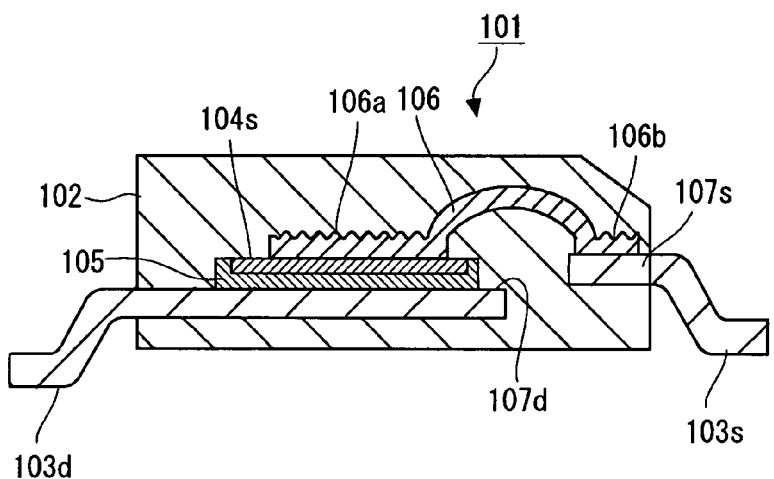
FIG. 6B is a cross-sectional view of FIG. 6A.
Figure 7:
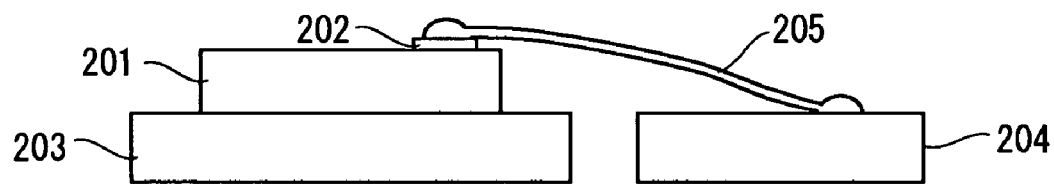
FIG. 7 is a cross-sectional view showing a semiconductor apparatus according to Japanese Unexamined Patent Application Publication No. 61-53737.

A third embodiment of the present invention is described hereinafter. The third embodiment uses a wire 27 for the connection between the lead 5 of the lead frame and the conductive bump 4. The wire 27 thus corresponds to the external wire according to the present invention. FIG. 5A is a plan view of the semiconductor apparatus according to the third embodiment of the invention, and FIG. 5B is a cross sectional view along line X-X of FIG. 5A. In the following description, the same elements as in the first embodiment are denoted by the same reference numerals and not described in detail herein.

As shown in FIGS. 5A and 5B, a connecting portion 27b formed at one end of the wire 27 and the lead 5 are electrically connected, and a connecting portion 27a formed at the other end of the wire 27 and the conductive bump 4 are also electrically connected. The wire 27 is made of Au, Cu, Ni, Ag, Al or Pd or an alloy mainly containing these. Although the wire 27 normally has a circular cross section, the both ends (the connecting portions 27a and 27b) of the wire 27 are flat-plate shaped in the example of FIG. 5 for easily laser welding of the lead 5 and the conductive bump 4. The connecting portion 27b of the wire 27 may be laser-welded with a conductive bump that is formed on an electrode pad of another semiconductor device, rather than with the lead 5, so that two semiconductor devices are connected through the wire 27.

The thickness of the flat-plate shaped connecting portion 27a of the wire 27 is preferably 1 to 30 times the height of the conductive bump 4 for the same reason as in the first embodiment. For easier laser welding, it is preferred that the connecting portion 27b to be welded with the lead frame 14 is also flat-plate shaped.

The method of manufacturing a semiconductor apparatus according to the third embodiment performs the laser welding of the connecting portion 27a and the conductive bump 4, thereby preventing mechanical damage to the semiconductor device 2. Further, with the use of the conductive bump 4, thermal damage to the semiconductor device 2 can be avoided by adjusting the height of the conductive bump 4 based on the thickness of the connecting portion 27a. It is thereby possible to provide a semiconductor apparatus with high reliability and productivity.

It is apparent that the present invention is not limited to the above embodiment and it may be modified and changed without departing from the scope and spirit of the invention.

What is claimed is:

1. A method of manufacturing a semiconductor apparatus comprising:

forming an electrode on a semiconductor device;

forming a plurality of conductive bumps on the electrode;

mounting the semiconductor device on a die pad of a lead frame;

placing one end of an individual electrical member different from the lead frame on the conductive bumps and the other end of the individual electrical member on a lead of the lead frame;

applying a laser beam to a plurality of positions of the individual electrical member corresponding to that of the conductive bumps to form a plurality of laser welded portions and to establish electrical connections between the one end of the individual electrical member and the conductive bumps; and applying a laser beam to another position of the individual electrical member corresponding to that of the lead to establish electrical connection between the other end of the individual electrical member and the lead.

2. The method of manufacturing a semiconductor apparatus according to claim 1, wherein
   the semiconductor device includes a Metal-Oxide-Semiconductor Field-Effect Transistor.

3. The method of manufacturing a semiconductor apparatus according to claim 1, wherein
   the semiconductor apparatus has an operational current of 1 to 200 A.

4. The method of manufacturing a semiconductor apparatus according to claim 1, wherein
a thickness of the individual electrical member is 1 to 30 times a height of the conductive bumps.

5. The method of manufacturing a semiconductor apparatus according to claim 1, wherein
a height of the conductive bumps is determined based on a thickness of the individual electrical member.

6. The method of manufacturing a semiconductor apparatus according to claim 1, wherein
the individual electrical member is a ribbon-like connecting member, and the plurality of laser-welded portions formed in the one end of the individual electrical member are arranged in a grid manner.

7. The method of manufacturing a semiconductor apparatus according to claim 1, wherein
the individual electrical member is composed of a plurality of lead-like connecting members, and the plurality of laser-welded portions formed in the one end of each of the lead-like connecting members are arranged in a dotted line manner.

8. The method of manufacturing a semiconductor apparatus according to claim 2, wherein, for the semiconductor apparatus formed by the method
the electrode, the conductive bumps, the individual electrical member and the lead function as a source electrode of the Metal-Oxide-Semiconductor Field-Effect Transistor, and the die pad functions as a drain electrode thereof.

9. The method of manufacturing a semiconductor apparatus according to claim 8, further comprising
laser welding one end of another individual electrical member of the semiconductor apparatus and another conductive bump formed on another electrode of the semiconductor device; and
laser welding an other end of the another individual electrical member and an another lead of a lead frame of the semiconductor apparatus;
wherein, for the semiconductor apparatus formed by the method, the another electrode, the another conductive bump, the another individual electrical member and the another lead function as a gate electrode of the Metal-Oxide-Semiconductor Field-Effect Transistor.

10. The method of manufacturing a semiconductor apparatus according to claim 1, wherein
the conductive bumps are made of a metal containing at least one of Au, Cu, Ni, Ag, Al, Pd, Sn and Pb.

11. The method of manufacturing a semiconductor apparatus according to claim 1, wherein
the electrode is made of a metal containing at least one of Au, Cu, Ni, Ag, Al and Pd.

12. The method of manufacturing a semiconductor apparatus according to claim 1, wherein
the individual electrical member is made of a metal containing at least one of Au, Cu, Ni, Ag, Al and Pd.

13. The method of manufacturing a semiconductor apparatus according to claim 12, wherein
the individual electrical member is made of Cu or Cu alloy with a surface plated with Ni.

14. The method of manufacturing a semiconductor apparatus according to claim 12, wherein
the electrode and the individual electrical member are both made of a metal containing at least one of Au, Cu, Ni, Ag, Al and Pd.

* * * * *